US006762466B2

(12) United States Patent
Huang et al.

(10) Patent No.: US 6,762,466 B2
(45) Date of Patent: Jul. 13, 2004

(54) CIRCUIT STRUCTURE FOR CONNECTING BONDING PAD AND ESD PROTECTION CIRCUIT

(75) Inventors: Shao-Chang Huang, Chia-Yi Hsien (TW); Jin-Tau Chou, Pingtung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 62 days.

(21) Appl. No.: 10/122,898

(22) Filed: Apr. 11, 2002

(65) Prior Publication Data

US 2003/0193071 A1 Oct. 16, 2003

(51) Int. Cl.[7] ............................................. H01L 29/76
(52) U.S. Cl. ........................ 257/395; 257/360; 257/365; 257/382; 257/383
(58) Field of Search ................................. 257/360, 365, 257/382, 383, 395

(56) References Cited

U.S. PATENT DOCUMENTS 6,462,384 B2 * 10/2002 Kwon ........................ 257/360

* cited by examiner

Primary Examiner—Richard Elms
Assistant Examiner—Douglas Menz
(74) Attorney, Agent, or Firm—J.C. Patents

(57) ABSTRACT

A circuit structure for connecting a bonding pad with an electrostatic discharge protection circuit. The circuit structure includes a plurality of conductive layers, a first plurality of first vias, a first conductive line, a plurality of second conductive lines and a plurality of second vias. The conductive layers are parallel layers each at a different height level between the bonding pad and a substrate. The first vias connect the bonding pad electrically with a neighboring conductive layer as well as each neighboring conductive layer. The first conductive line connects electrically with the conductive layer nearest the substrate and the drain terminal of an ESD protection circuit. The second conductive lines are parallel lines each at a different height level between the first conductive line and the bonding pad. Each second conductive line connects electrically with the conductive layer at a corresponding height level. The second vias connect electrically with the first conductive line and the second conductive line adjacent to the first conductive line as well as each neighboring second conductive line.

9 Claims, 3 Drawing Sheets $W_1 + W_2 = W$

CIRCUIT STRUCTURE FOR CONNECTING BONDING PAD AND ESD PROTECTION CIRCUIT

BACKGROUND OF THE INVENTION

1. Field of Invention

The present invention relates to a circuit structure for connecting a bonding pad and an electrostatic discharge (ESD) protection circuit. More particularly, the present invention relates a multiple path circuit structure for connecting a bonding pad and an ESD protection circuit such that the multiple paths permit the discharge of a larger current and hence improve circuit protection capacity.

2. Description of Related Art

Electrostatic discharge is a phenomenon that occurs when static charge moves on a non-conducting surface. Sudden movement of electric charges inside the semiconductor material of an integrated circuit (IC) package often leads to circuit failure. For example, somebody walking across a carpet may pick up static charges. If the surrounding air has a high relative humidity (RH), the body of a person may charge up to a few thousand volts. However, if the surrounding air has a low RH, the body of a person may charge up to ten thousand or more volts. IC packaging machines or testing equipment may also accumulate charges and produce from several hundred to several thousand volts of static electricity. As the aforementioned charged bodies (human, machine or equipment) come in contact with a silicon chip, the sudden surge in power due to the sudden movement of static charges through the chip may damage the internal circuits or cause malfunction.

To minimize the damaging effect of electrostatic discharge on integrated circuits, special ESD protection schemes have been developed. The most common method is the provision of a hardware discharge route. In other words, an on-chip ESD protection circuit is provided between the internal circuit and each bonding pad.

FIG. 1 is a schematic cross-sectional view showing a conventional circuit structure that connects an ESD protection circuit with the bonding pad of a semiconductor device. FIG. 2 is a perspective view of the circuit structure shown in FIG. 1. Note that the dielectric layers in FIGS. 1 and 2 are not shown. As shown in FIGS. 1 and 2, the bonding pad 100 is formed in the uppermost layer of the semiconductor device and the ESD protection circuit 118 is formed within the substrate 50. The bonding pad 100 connects sequentially, in a downward direction, with a via 102, a conductive layer 104, a second via 106, a second conductive layer 108, a third via 110, a third conductive layer 112. The third conductive layer 112 has an extension line 112a that extends to a region above the drain terminal 116 of the ESD protection circuit 118. The extension line 112a and the drain terminal 116 are connected through a contact 114. In addition, an insulating layer 130 encloses the aforementioned circuit components and separates the bonding pad 100 from the substrate 50.

During an electrostatic discharge, static electricity flows from the bonding pad 100 to the ESD protection circuit 118 via an external circuit. In other words, current discharges from the bonding pad 100 via the first via 102, the first conductive layer 104, the second via 106, the second conductive layer 108, the third via 110, the third conductive layer 112, the extension line 112a and the drain terminal 116 of the ESD protection circuit 118. Since static charges are channeled away via the ESD protection circuit 118, possible damage to the internal circuits is prevented.

According to FIGS. 1 and 2, static electricity is discharged through the single metallic layer (that is, the extension line 112a) to the ESD protection circuit 118. When a sufficiently large current flows through the extension line 112a, the extension line 112a may fuse leading to malfunction of the ESD protection circuit 118. To prevent the fusing of the extension line 112a due to an over-current, width of the extension line 112a is increased. However, as semiconductor devices continue to be miniaturized, a widening of line width implies a lowering of processing window as well as level of integration.

SUMMARY OF THE INVENTION

Accordingly, one object of the present invention is to provide a circuit structure for connecting the bonding pad of a semiconductor device with an electrostatic discharge (ESD) protection circuit so that the device has better electrostatic discharge protection.

A second object of this invention is to provide a circuit structure for connecting the bonding pad of a semiconductor device with an electrostatic discharge (ESD) protection circuit such that line width of the conductive connection wire can be reduced, thereby increasing the manufacturing process window.

To achieve these and other advantages and in accordance with the purpose of the invention, as embodied and broadly described herein, the invention provides a circuit structure for connecting a bonding pad with an electrostatic discharge protection circuit. The circuit structure includes a plurality of conductive layers, a plurality of first vias, a first conductive line, a plurality of second conductive lines and a plurality of second vias. The conductive layers are parallel layers each at a different height level between the bonding pad and a substrate. The first vias connect the bonding pad electrically with a neighboring conductive layer as well as each neighboring conductive layer. The first conductive line connects electrically with the conductive layer nearest the substrate and the drain terminal of an ESD protection circuit. The second conductive lines are parallel lines each at a different height level between the first conductive line and the bonding pad. Each second conductive line connects electrically with the conductive layer at a corresponding height level. The second vias connect electrically with the first conductive line and the second conductive line adjacent to the first conductive line as well as each neighboring second conductive line.

In brief, the circuit structure of this invention has a multi-layered path structure consisting of first conductive lines and second conductive lines. Since current may diverge and pass through each of these multiple pathways, current running inside each of these sub-pathways is relatively small. Hence, line width of each conductive line may be reduced so that more flexibility in the circuit design is permitted.

In addition, the presence of multiple paths in the circuit structure has an additional advantage. Even when one of these conductive lines (paths) is accidentally severed, other conductive lines may still conduct current away and hence safeguard against complete failure of ESD protection.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
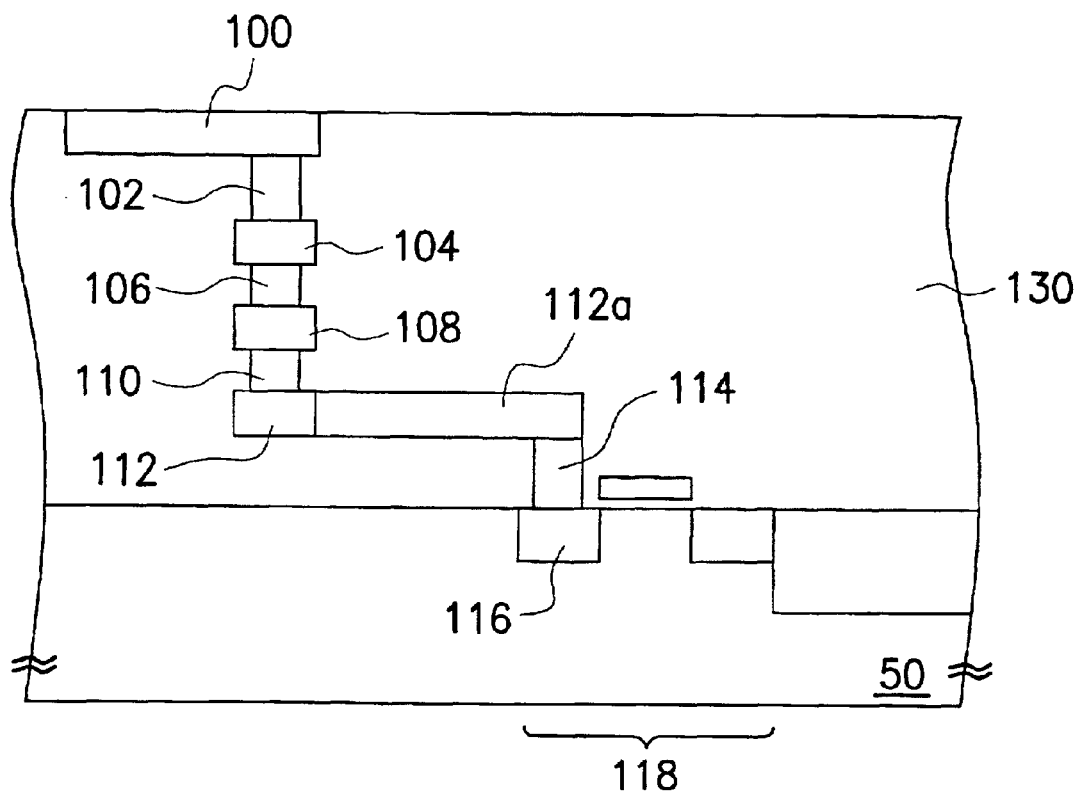
FIG. 1 is a schematic cross-sectional view showing a conventional circuit structure that connects an ESD protection circuit with the bonding pad of a semiconductor device.
Figure 2:
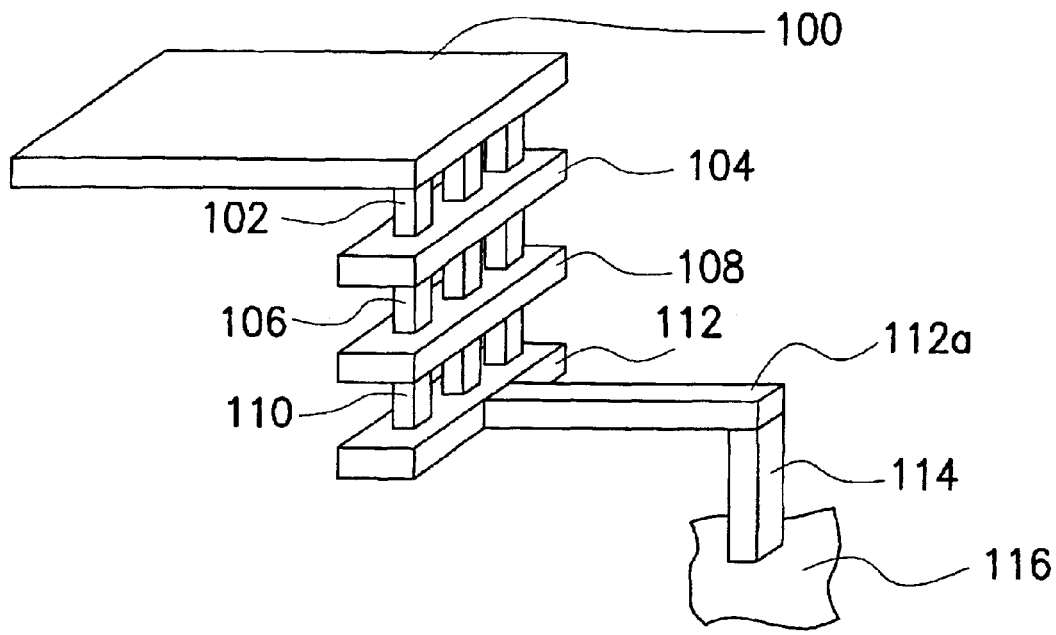
FIG. 2 is a perspective view of the circuit structure as shown in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
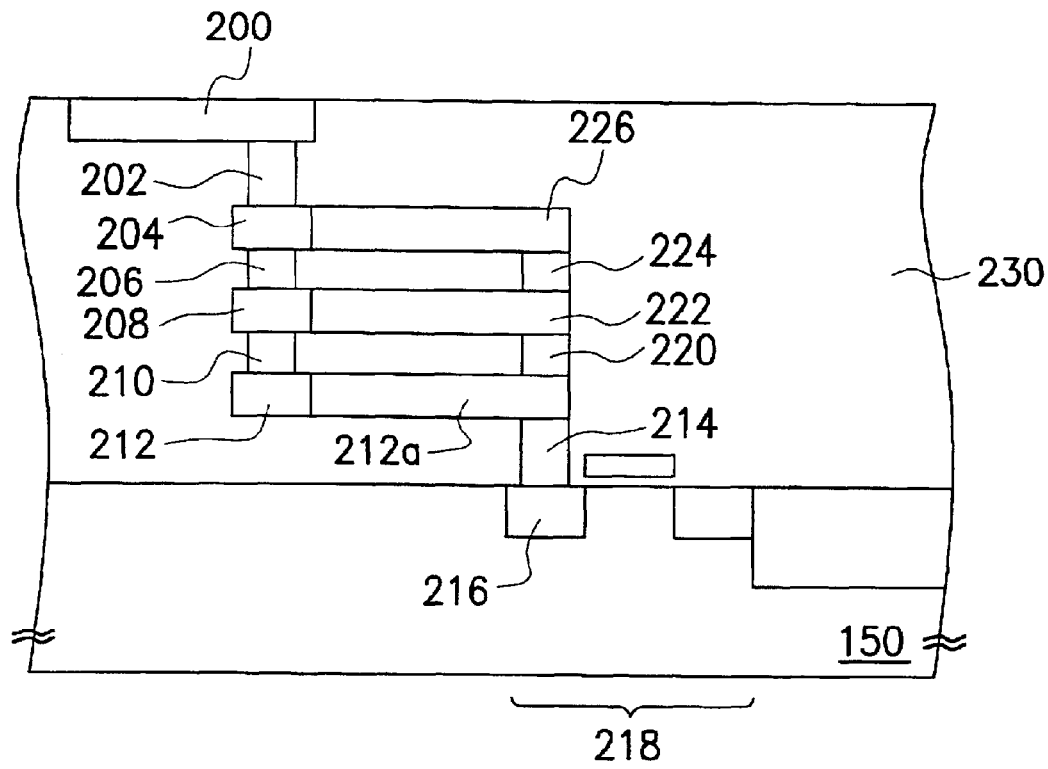
FIG. 3 is a schematic cross-sectional view showing a circuit structure that connects an ESD protection circuit with the bonding pad of a semiconductor device, according to the present invention.
Figure 4:
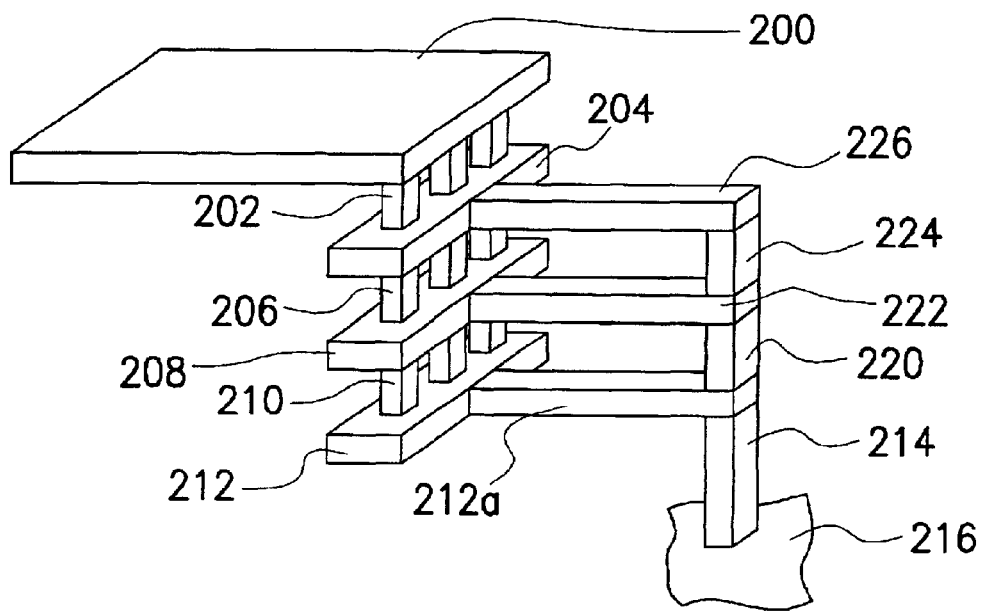
FIG. 4 is a perspective view of the circuit structure shown in FIG. 3, according to the present invention.

FIG. 3 is a schematic cross-sectional view showing a circuit structure that connects an ESD protection circuit with the bonding pad of a semiconductor device. FIG. 4 is a perspective view of the circuit structure shown in FIG. 3.

As shown in FIGS. 3 and 4, an external circuit structure connects a bonding pad 200 with an electrostatic discharge (ESD) protection circuit 218. The circuit structure includes a first via 202, a first conductive layer 204, a second via 206, a second conductive layer 208, a third via 210, a third conductive layer 212, an extension line 212a, a contact 214, a fourth via 220, a first dummy conductive line 222, a fifth via 224 and a second dummy conductive line 226.

The bonding pad 200 is the uppermost layer of the semiconductor device and the ESD protection circuit 218 is buried within a substrate 150. The bonding pad 200 is sequentially connected, in a downward direction, to the first via 202, the first conductive layer 204, the second via 206, the second conductive layer 208, the third via 210, the third conductive layer 212 and the extension line 212a that extends to a region above the drain terminal 216 of the ESD protection circuit 218. The extension line 212a and the drain terminal 216 of the ESD protection circuit 218 within the substrate 150 are electrically connected through the contact 214. The first via 202, the first conductive layer 204, the second via 206, the second conductive layer 208, the third via 210, the third conductive layer 212 and the extension line 212a are all made from a conductive material such as copper.

The conductive lines 222 and 226 serve as dummy conductive lines in this invention. As shown in FIGS. 3 and 4, the dummy conductive line 222 and the conductive layer 208 are electrically connected. The dummy conductive line 222 is also electrically connected to the extension line 212a through the via 220. Similarly, the dummy conductive line 226 and the conductive line 202 are electrically connected. The dummy conductive line 226 is also electrically connected to the dummy conductive line 222 through the via 224. The via 220, the dummy conductive line 222, the via 224 and the dummy conductive line 226 are all made from a conductive material such as copper. In addition, an insulation layer 230 encloses all the aforementioned layers and vias between the bonding pad 200 and the substrate 150.

If both the dummy conductive lines (222 and 226) and the conductive layers are made from an identical material, the dummy lines 222 and 226 may be formed together with the process of fabricating the conductive layers 208 and 204 respectively. Hence, the addition of dummy conductive lines will not increase the steps in manufacturing the semiconductor device. Moreover, since the conductive line and the conductive layer are made from an identical material, both the conductive line 222 and the conductive layer 208 as well as the conductive line 226 and the conductive layer 204 can be regarded as single conductive layers.

During an electrostatic discharge, discharge current flowing into the circuit structure may take up one of three separate routes. In other words, current may travel through multiple paths including the conductive line 226, the conductive line 222 and the extension line 212a. The three current carrying routes not only bring down current density in each, but also permits current conduction even when one or two of the conductive lines (paths) is severed. Consequently, possibility of ESD protection failure is greatly minimized.

Furthermore, by channeling discharge current through multiple paths, current flowing through each of the conductive lines, that is, the conductive line 226, the conductive line 222, or the extension line 212a, will be much smaller. Hence, the width of these conductive lines may be reduced accordingly. Such an arrangement increases the flexibility of design as well as the level of integration inside a semiconductor package.

Material constituting the conductive lines (222, 226 and 212a) and the conductive layers (204, 208 and 212) is not limited to copper. Other materials such as diffusion resistor or polysilicon may also be used to increase the ESD protection capacity. In addition, different materials may be used to fabricate the dummy conductive lines and the conductive layers depending on actual requirements. For example, in a circuit having a multiple path structure, dummy conductive lines each made from a different material including copper, polysilicon and diffusion resistor is permissible.

The external circuit structure in the aforementioned embodiment has three conductive layers and two dummy conductive lines altogether. However, this configuration is by no means the only possible structural layout. The number of conductive layers and dummy conductive lines may vary according to demand.

Figure 5A:
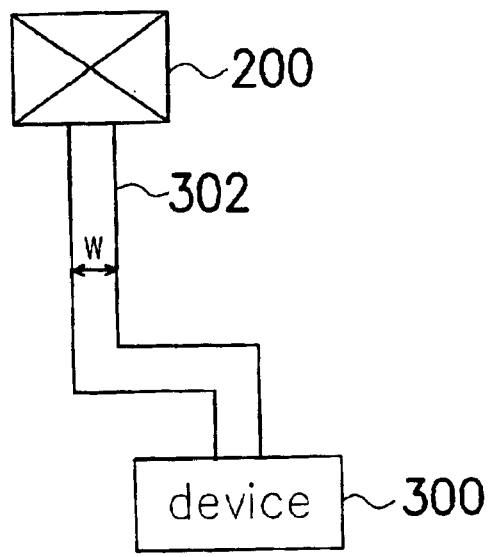
FIGS. 5A–5B are cross-sectional views, schematically illustrating other circuit structures that connect an ESD protection circuit with the bonding pad, according to the present invention.
Figure 5B:
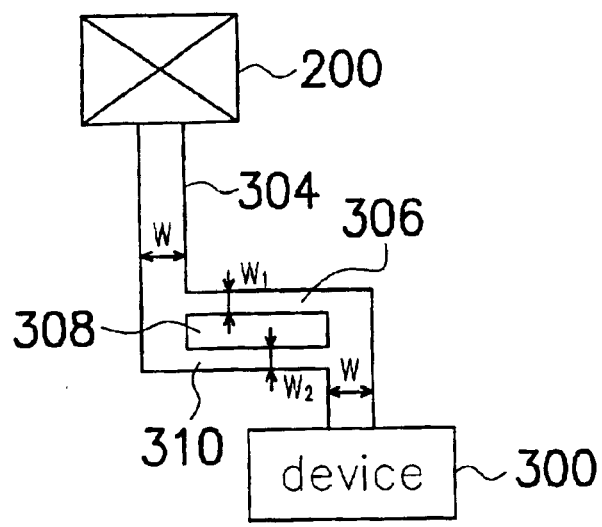

FIGS. 5A–5B are cross-sectional views, schematically illustrating other circuit structures that connect an ESD protection circuit with the bonding pad, according to the present invention. In FIG. 5A, a metal element is connected between the bonding pad 200 and a device 300, such as an ESD protection circuit, which is formed on a substrate as previously described. The metal element 302 can include a first vertical portion, a horizontal portion, and a second vertical portion. One end of the first vertical portion is connected to the bonding pad 200. The first vertical portion extends downward to a distance. The horizontal portion then horizontally extends toward the device. Then, the second vertical portion extends from the end of the horizontal portion to the device in contact. As a result, it forms a right-angle bent structure as shown in FIG. 5A. In general, the metal element in three portions have individual widths. Preferably, all of these three portions have the same width.

In FIG. 5A, only one metal element is shown at the cross-sectional view. For the actual design, the circuit structure can include additional metal elements, similar to the structure shown in FIG. 5A. The width can be different. As a result, the connection circuit structure can include several pathways in a similar structure (FIG. 5A) but may have a different width for some pathways. In this design, since it includes several individual pathways, the layout may be more complicated.

Alternatively, from the layout point of view, a portion, such as the horizontal portion, of the metal element can be replaced by several horizontal sub-elements. In FIG. 5B, the horizontal portion in FIG. 5A, for example, is modified into two horizontal sub-elements 306, 310, which are separated by a gap 308. The horizontal sub-elements 306, 310 individually have widths of w1 and w2. However, the width can be adjusted depending on the actual design. The number of the horizontal sub-elements is also not only limited to two. However, preferably, a total width of the horizontal sub-elements is about equal to the desired width w. As a result, the ESD current is branched into the horizontal sub-elements 306, 310. If one of the horizontal sub-elements is broken, the ESD current still can flow through the other horizontal sub-elements. In general, the structures as shown in FIGS. 5A–5B can be combined. For example, it can include one pathway with a structure in FIG. 5A and one pathway with the structure in FIG. 5B. The width for the metal elements is not limited to the drawings.

In conclusion, this invention produces a circuit having a multiple path structure so that current may travel through multiple routes. Since current flowing through each route is smaller, the production of conductive lines having a narrower width is permissible. Ultimately, circuit design is more flexible and a higher level of integration is possible. Furthermore, with a multiple path structure, capacity to discharge current remains even when one conductive line (path) is severed. Hence, ESD protection capacity is improved. In addition to copper, other materials such as diffusion resistant material or polysilicon may be employed to form the multiple pathways so that ESD protection capacity is boosted. Finally, the multiple path structure may be fabricated using conventional semiconductor manufacturing processes so that no addition costs are incurred.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit structure for connecting a bonding pad with an electrostatic discharge (ESD) protection circuit on a substrate, comprising:

a plurality of conductive layers in parallel and each at a different height level between the bonding pad and the substrate;

a plurality of first vias electrically connected with the bonding pad and the conductive layer next to the bonding pad as well as neighboring conductive layers;

a first conductive line connected directly with the conductive layer closest to the substrate as well as a drain terminal of the ESD protection circuit;

a plurality of second conductive lines in parallel and each at a different height level between the first conductive line and the bonding pad, wherein each second conductive line connects directly with one of the conductive layers at the same height level; and a plurality of second vias electrically connected with the first conductive line and the second conductive line next to the first conductive line as well as each neighboring second conductive line, wherein the second vias are not in direct contact with the conductive layers.

2. The circuit structure of claim 1, wherein the structure further includes an insulation layer that encloses the circuit structure.

3. The circuit structure of claim 1, wherein the first conductive line and the ESD protection device are electrically connected through a contact.

4. The circuit structure of claim 1, wherein material forming the second conductive lines includes copper.

5. The circuit structure of claim 1, wherein the second conductive line includes a diffusion resistor.

6. The circuit structure of claim 1, wherein material forming the second conductive lines includes polysilicon.

7. The circuit structure of claim 1, wherein material forming the first vias and the second vias includes copper.

8. The circuit structure of claim 1, wherein material forming the second conductive layers and the first conductive line includes copper.

9. The circuit structure of claim 1, wherein each conductive layer is formed using a material selected from a group consisting of copper, polysilicon and diffusion resistor.

* * * * *